United States Patent [19]

Brassell et al.

[11] 4,332,751

[45] Jun. 1, 1982

[54] METHOD FOR FABRICATING THIN FILMS OF PYROLYTIC CARBON

[75] Inventors: Gilbert W. Brassell, Lenoir City; John Lewis, Jr., Oak Ridge, both of Tenn.; Gary W. Weber, Amherst, N.Y.

[73] Assignee: The United States of America as represented by the United States Department of Energy, Washington, D.C.

[21] Appl. No.: 129,868

[22] Filed: Mar. 13, 1980

[51] Int. Cl.³ .................... B29C 25/00; B29C 7/00
[52] U.S. Cl. .................... 264/28; 264/29.1; 264/29.6; 264/81; 264/334
[58] Field of Search ............. 427/228; 264/29.1, 29.6, 264/81, 28, 334

[56] References Cited

U.S. PATENT DOCUMENTS

| | | | |
|---|---|---|---|
| 3,027,278 | 3/1962 | Reick | 427/228 |
| 3,167,447 | 1/1965 | Tully et al. | 427/228 |
| 3,410,746 | 11/1968 | Turkat et al. | 264/29.6 |
| 3,442,617 | 5/1969 | Turkat et al. | 264/81 |
| 3,462,522 | 8/1969 | Clark et al. | 264/29.6 |
| 3,657,404 | 4/1972 | Ettinger | 264/81 |
| 3,673,051 | 6/1972 | Clark et al. | 264/29.6 |
| 3,686,378 | 8/1972 | Dietze | 264/81 |
| 3,751,539 | 8/1973 | Reuschel et al. | 264/81 |
| 3,892,827 | 7/1975 | Keller et al. | 264/81 |
| 3,900,540 | 8/1975 | Robba et al. | 264/334 |
| 3,949,106 | 4/1976 | Araki et al. | 264/81 |

Primary Examiner—Willard E. Hoag
Attorney, Agent, or Firm—Earl L. Larcher; Stephen D. Hamel; Richard G. Besha

[57] ABSTRACT

The present invention relates to a method for fabricating ultra-thin films of pyrolytic carbon. Pyrolytic carbon is vapor deposited onto a concave surface of a heated substrate to a total uniform thickness in the range of about 0.1 to 1.0 micrometer. The carbon film on the substrate is provided with a layer of adherent polymeric resin. The resulting composite film of pyrolytic carbon and polymeric resin is then easily separated from the substrate by shrinking the polymeric resin coating with thermally induced forces.

6 Claims, No Drawings

METHOD FOR FABRICATING THIN FILMS OF PYROLYTIC CARBON

This invention was made as a result of a contract with the U.S. Department of Energy.

BACKGROUND OF THE INVENTION

The present invention relates generally to the fabrication of thin films of pyrolytic carbon and, more particularly, to a method of fabricating such thin films which are characterized by an essentially uniform thickness in a range of about 0.1 to 1.0 micrometer and essentially isotropic properties.

Pyrolytic carbon has been found to be a useful material in many applications where the refractory characteristics of the material are particularly desirable and also where the isotropic strength properties of the materials are useful in unidirectional reinforcement applications. Ultra-thin films of pyrolytic carbon are especially useful where the graphite is used as a conductor in high-energy plasma generation or as a neutron getter.

Pyrolytic carbon structures including coatings and films have been satisfactorily fabricated by chemical vapor deposition procedures as are well known in the art. Various such deposition procedures are described in detail in the publication "Vapor Deposition", 1966, edited by C. F. Powell et al, and published by John Wiley & Sons, New York, N.Y. Typically, in a chemical vapor deposition process, a hydrocarbon gas in the presence of a diluent gas therefor is exposed to a substrate at a temperature sufficient to decompose the hydrocarbon gas and thereby form a coating of pyrolytic carbon on the surface of the substrate. The formation of the thin coatings or films of pyrolytic carbon on various substrate materials presents some problems when separating the vapor-deposited films from the substrates, especially the very thin films, due to the fragility of the films.

Efforts to fabricate thin pyrolytic carbon films have been somewhat successful. For example, in U.S. Pat. No. 3,900,540 which issued Aug. 19, 1975, to William A. Robba et al, films of pyrolytic carbon were fabricated by the vapor deposition of the hydrocarbon gas and its diluent onto a substrate formed of an inert liquid. The selected liquid is capable of being heated to a temperature sufficient to effect the decomposition of the hydrocarbon gas thereon for forming the pyrolytic carbon film. This film is also deposited upon parallel carbon fibers positioned over the liquid substrate so that the fibers may be utilized to pull and separate the film from the substrate. The film can be later separated from the carbon fibers and wound upon a storage drum. While this technique for fabricating thin films of pyrolytic carbon has been satisfactory for many applications, its use would be somewhat limited in the preparation of ultra-thin films having a maximum thickness of only about 1.0 micrometer. Also, the fabrication of films in seamless configurations cannot be successfully achieved due to the fixed shape of the liquid substrate in the aforementioned patent.

SUMMARY OF THE INVENTION

Accordingly, it is the primary objective or aim of the present invention to provide a process for fabricating pyrolytic carbon films, especially films in the form of seamless tabulations, wherein the films are ultra-thin with a maximum thickness of about 1.0 micrometer and exhibit isotropic properties. In general, this objective is achieved by fabricating a composite film of pyrolytic carbon and a polymeric resin by the steps of providing a relatively non-porous mandrel or substrate with a concave surface of revolution. Forming a layer or film of pyrolytic carbon of the desired thickness on the concave surface is achieved by exposing the latter to a gaseous mixture containing a selected hydrocarbon gas and an inert diluent gas therefor while the substrate is at a temperature sufficient to decompose the hydrocarbon gas contacting the concave surface. The resulting layer of pyrolytic carbon is provided with an adherent coating of a polymeric resin which is characterized by shrinking upon exposure to thermally induced stresses or forces, such as sub-ambient temperatures. The composite film and the substrate are then subjected to such thermally induced forces to effect the separation of the composite film from the substrate by the shrinking of the polymeric resin coating.

The polymeric resin coating provides a sufficient structural support for the pyrolytic carbon film so that the composite film may be easily handled. In the event the utilization of the pyrolytic carbon film is best achieved by the elimination of the polymeric resin coating, the coating may be readily removed by subjecting it to a suitable solvent or by heating the composite film to a temperature sufficient to effect the decomposition of the polymeric resin.

Other and further objects of the invention will be obvious upon an understanding of the illustrative method about to be described or will be indicated in the appended claims, and various advantages not referred to herein will occur to one skilled in the art upon employment of the invention in practice.

DETAILED DESCRIPTION OF THE INVENTION

As generally described above, the present invention is directed to the fabrication of ultra-thin films of pyrolytic carbon. In accordance with this invention pyrolytic carbon of the desired film thickness is vapor deposited onto a substrate and then removed intact from the substrate. The method is practiced by depositing a film of pyrolytic carbon onto a concave surface of a substrate from a gaseous mixture of a selected hydrocarbon and a diluent gas therefor at a deposition temperature in the range of about 900°–1800° C. The resulting film of pyrolytic carbon is then provided with an adherent coating of a selected polymeric resin. The resulting composite film is separated from the substrate by shrinking the polymeric resin coating with thermally induced forces for effectively and uniformly pulling the composite film from the substrate. The composite film has a total thickness of about 10 micrometers with the pyrolytic carbon film providing about 0.1 to 1.0 micrometer of this total.

The pyrolytic carbon film of the present invention can be readily formed by employing vapor deposition techniques such as described in the aforementioned patent and the vapor deposition publication. In accordance with such techniques the pyrolytic carbon is formed from a source gas comprising a mixture of a hydrocarbon gas and a diluent gas such as helium or argon. The hydrocarbon gas most commonly used is methane but a halogen-free gas, such as ethane, propane, acetylene, napthalene, benzene and toluene may be readily substituted for the methane.

The vapor deposition is achieved by heating the substrate to a temperature in the range of about 900°–1800° C. in an environment at atmospheric pressure. The formation of the film in the 0.1 to 1.0 micrometer range takes approximately 0.5 to 5 hours at a deposition rate of about 1 microgram per centimeter per minute.

The mandrels or substrates used to practice the present invention are of a configuration defined by a concave surface of revolution ranging from a simple concave disk to a complete tubular structure. To facilitate the separation of the pyrolytic carbon film from the substrate the latter should be essentially pore-free and have a non-adhering smooth surface. Fused silica is a satisfactory substrate material since it has a softening point greater than 900° C. and a satisfactory coefficient of thermal expansion in the range of about $1 \times 10^{-7}$ to $10 \times 10^{-7}$ in/°C. as well as a relatively non-porous and non-adhering surface. Substrates may also be satisfactorily constructed from other materials such as molybdenum or tungsten.

The chemical vapor deposition of the isotropic carbon is preferably achieved at a temperature less than about 1100° C. with a gas composition of methane and argon to assure the formation of an isotropic film. At temperatures greater than about 1100° C. the film deposited does not have the bidirectional properties of the isotropic carbon. However, in the event isotropic properties are not required for the practice or utilization of the films of the present invention, higher deposition temperatures may be readily utilized.

With the completion of the pyrolytic carbon film formation the polymeric resin coating may be readily applied by immersing the mandrel with the film thereon into a solution containing the polymeric resin. Utilization of the polymeric resins for separating the carbon film by employing thermally induced stresses facilitates the separation of the pyrolytic carbon film from the surface of the mandrel with minimal damage to the ultra-thin film and also provides a support for the film that significantly facilitates the handling of the film. Various polymeric resins may be utilized in practicing the present invention, for example, polyvinyl alcohol, polyvinyl chloride, polyvinylidene chloride and polybutyl styrene may be satisfactorily employed. These resins are prepared for the coating step by dissolving them in an appropriate solvent. For example, the polyvinylidene chloride may be dissolved in tetrahydrofuran while the polyvinyl alcohol may be dissolved in water. The thickness of the resin coating on the pyrolytic carbon is a function of the concentration of the resin in the solution. Preferably, the resin coating is of a thickness in the range of about 1 to 10 micrometers. A resin coating thicker than about 10 micrometers will undergo excess shrinkage and damage the carbon film. Conversely, a resin coating thinner than about 1 micrometer will not shrink enough for effecting the removal of the carbon film from the mandrel. The polymeric resins found to be most satisfactory for separating the carbon coating or film from the mandrel by employing thermally induced forces is either polyvinylidene chloride or the polyvinyl alcohol resins. In any event the resin coating must be relatively flexible and provide a constant uniform force or tension for separating the carbon film from the mandrel.

The thermally induced forces utilized for shrinking the polymeric resin and thereby separating the carbon film from the concave surface of the mandrel may be achieved by confining the mandrel and the composite film in an environment at a temperature in the range of about $-20°$ to $-40°$ C. for a duration in the range of about 0.5 to 8 hours. During the course of this time the polymeric resin undergoes sufficient shrinkage to pull the pyrolytic carbon film from the surface of the mandrel.

The present invention lends itself to the fabrication of seamless films of pyrolytic carbon which may be readily achieved by coating the interior of a mandrel having a tubular configuration. As briefly pointed out above, this invention may be practiced on any mandrel surface having a concave surface of revolution.

In order to provide a more facile understanding of the present invention an example is set forth below wherein the method of the present invention is practiced in the preparation of seamless tubes of pyrolytic carbon.

EXAMPLE

Four fused silica cylinders having an inside diameter of 2.5 inches, a height of 1 inch and a wall thickness of 0.1 inch were cleaned in methyl alcohol and then rinsed in deionized water. The four cylinders were confined in an induction heated chemical vapor deposition furnace for the coating operation. With the cylinder heated to a temperature of 1050° C., a coating gas composition of methane and argon in a methane-to-gas ratio of 1:6 was introduced into the furnace for a duration of 1 hour to form an isotropic film having 47 micrograms/cm$^2$ or a thickness of 0.2 micrometer. After completing the vapor deposition step, the isotropic-carbon film bearing mandrels were slowly cooled and then dipped into a solution of tetrahydrofuran containing 10–15% of polyvinylidene chloride for a duration of 5–15 seconds. A resin coating of a thickness of about 10 micrometers was formed on the isotropic film of pyrolytic carbon. The coated mandrels were allowed to set at room temperature for 2 hours and were then inserted into a freezer at a temperature of $-40°$ C. for an 8-hour duration. During this confinement the composite coating was pulled from the mandrel by the shrinking of the polymeric resins. Visual examination of each of the resulting tubular composites indicated a flexible, structurally intact film that could be readily handled and transported.

As briefly pointed out above, the method of the present invention is directed to the fabrication of an ultra-thin film of pyrolytic carbon by forming the film and coating it with the layer of polymeric resin for effecting the release of the film from the mandrel as well as providing a support mechanism therefor. If it is desired to utilize the pyrolytic carbon film in an application where the polymeric resin is not needed or would be undesirable, the coating of polymeric resin may be readily removed in any suitable manner. For example, with the polyvinyl alcohol the polymeric resin may be dissolved in water. Alternatively, if desired the composite film may be placed in an environment at a temperature sufficiently elevated to volatilize the film. Normally such polymeric resins volatilize at a temperature in the range of about 300° to 500° C.

It will be seen that the present invention provides a mechanism for producing ultra-thin films of pyrolytic carbon as well as providing a supporting mechanism for facilitating the handling and transport of the films to the point of use.

What is claimed is:

1. A method for fabricating a composite structure consisting of a film of pyrolytic carbon with an adherent coating of polymeric resin thereon, comprising the steps of forming a film of pyrolytic carbon on a substrate having a concave surface of revolution by contacting said concave surface with a gaseous composition containing a hydrocarbon gas and an inert diluent gas therefor while maintaining the substrate at a temperature sufficient to decompose the hydrocarbon gas contacting the concave surface of the substrate to form said film thereon, depositing on the resulting film of pyrolytic carbon an adherent coating of a polymeric resin characterized by shrinking upon chilling to a temperature below 0° C., and chilling the polymeric coating substrate to a temperature below 0° C. to sufficiently shrink the polymeric resin coating to effect the separation of the pyrolytic carbon film attached thereto from the substrate.

2. The method claimed in claim 1, wherein the film of pyrolytic carbon is of a thickness in the range of 0.1 to 1.0 micrometer, and wherein the combined thickness of the pyrolytic carbon film and the polymeric resin coating is in the range of about 1 to 10 micrometers.

3. The method claimed in claim 2, wherein the substrate is fused silica, the hydrocarbon gas is methane, the inert diluent gas is helium or argon, and the temperature sufficient to decompose the hydrocarbon gas is in the range of about 900° to 1800° C.

4. The method claimed in claim 2, wherein the separation of the carbon film from the substrate is effected by maintaining the coated substrate at sub-ambient temperatures in the range of about −20° to −40° C. for a duration of about 0.5 to 8.0 hours.

5. The method claimed in claim 4, wherein the polymeric resin is selected from the group consisting of polyvinyl alcohol and polyvinylidene chloride, and wherein the step of coating of the pyrolytic carbon film with the polymeric resin is provided by immersing the film-bearing substrate in a solution containing the polymeric resin.

6. The method claimed in claim 4, wherein the substrate is of a tubular configuration, and wherein the composite film is provided on the inner surface of the substrate.

* * * * *